(12) United States Patent
Mouli (10) Patent No.: US 7,492,027 B2
(45) Date of Patent: Feb. 17, 2009

(54) REDUCED CROSSTALK SENSOR AND METHOD OF FORMATION

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 106 days.

(21) Appl. No.: 10/781,706

(22) Filed: Feb. 20, 2004

(65) Prior Publication Data

US 2005/0184353 A1 Aug. 25, 2005

(51) Int. Cl.
*H01L 31/00* (2006.01)
*H01L 27/148* (2006.01)
(52) U.S. Cl. .................. 257/446; 257/233; 257/292
(58) Field of Classification Search .................. 257/69, 257/222, 232, 233, 225, 226, 291, 292, 44, 257/444, 446
See application file for complete search history.

(56) References Cited

U.S. PATENT DOCUMENTS

| | | | |
|---|---|---|---|
| 4,416,050 A | 11/1983 | Sarace | |
| 4,760,273 A | 7/1988 | Kimata | |
| 5,317,432 A | 5/1994 | Ino | |
| 5,501,990 A | 3/1996 | Holm et al. | |
| 5,535,231 A | 7/1996 | Lee et al. | |
| 5,721,429 A | 2/1998 | Radford et al. | |
| 5,838,174 A | 11/1998 | Nakagawa et al. | |
| 5,903,026 A | 5/1999 | Gonzalez | |
| 6,114,251 A | 9/2000 | Nguyen et al. | |
| 6,118,142 A | 9/2000 | Chen et al. | |
| 6,177,333 B1 | 1/2001 | Rhodes | |
| 6,204,524 B1 | 3/2001 | Rhodes | |
| 6,225,171 B1 | 5/2001 | Yu et al. | |
| 6,372,603 B1 | 4/2002 | Yaung et al. | |
| 6,380,037 B1 | 4/2002 | Osanai | |
| 6,545,302 B2 | 4/2003 | Han | |
| 6,580,095 B2 | 6/2003 | Tani et al. | |
| 6,707,075 B1 | 3/2004 | Rogers et al. | |
| 6,720,595 B2 | 4/2004 | Clevenger et al. | |
| 6,767,759 B2 | 7/2004 | Rhodes | |
| 6,888,214 B2 | 5/2005 | Mouli et al. | |
| 6,930,336 B1 | 8/2005 | Merrill | |
| 7,026,691 B1 | 4/2006 | Sander et al. | |
| 7,333,370 B2 | 2/2008 | Tran | |
| 2001/0021559 A1 | 9/2001 | Norstrom et al. | |

(Continued)

FOREIGN PATENT DOCUMENTS

JP 63-009968 * 1/1988

OTHER PUBLICATIONS

Mendis, et al., "CMOS Active Pixel Image Sensor", IEEE Transactions on Electron Devices, vol. 41, No. 3, Mar. 1994, pp. 452-453.

(Continued)

*Primary Examiner*—Hung Vu
(74) *Attorney, Agent, or Firm*—Dickstein Shapiro LLP (57) ABSTRACT

Isolation methods and devices for isolating regions of a semiconductor device are disclosed. The isolation methods and structures include forming an isolating trench among pixels or other active areas of a semiconductor device. The trench extends through the substrate to the base layer, wherein a liner may be deposited on the side walls of the trench. A conductive material is deposited into the trench to block electrons from passing through.

39 Claims, 11 Drawing Sheets

U.S. PATENT DOCUMENTS

| | | |
|---|---|---|
| 2001/0023949 A1 | 9/2001 | Johnson et al. |
| 2003/0089929 A1* | 5/2003 | Rhodes ............... 257/219 |
| 2003/0111687 A1 | 6/2003 | Willer et al. |
| 2003/0127667 A1 | 7/2003 | Inoue et al. |
| 2003/0168701 A1 | 9/2003 | Steven H. Voldman |
| 2003/0209743 A1 | 11/2003 | Park |
| 2004/0075110 A1 | 4/2004 | Yaung et al. |
| 2004/0173865 A1 | 9/2004 | Scales et al. |
| 2004/0178430 A1 | 9/2004 | Rhodes et al. |
| 2004/0188727 A1 | 9/2004 | Patrick |
| 2004/0188739 A1 | 9/2004 | Takenaka et al. |
| 2004/0195592 A1 | 10/2004 | Fossum |
| 2004/0227061 A1* | 11/2004 | Clevenger et al. ....... 250/214 R |
| 2005/0017316 A1 | 1/2005 | Yaung |
| 2005/0045926 A1 | 3/2005 | Mouli |
| 2005/0061978 A1 | 3/2005 | Lida et al. |
| 2005/0121708 A1 | 6/2005 | Hong |
| 2005/0133825 A1 | 6/2005 | Rhodes et al. |
| 2005/0176167 A1 | 8/2005 | Lee |
| 2005/0184353 A1 | 8/2005 | Mouli |

OTHER PUBLICATIONS

Nixon et al., "256 x 256 CMOS Active Pixel Sensor Camera-on-a-Chip", IEEE Journal of Solid-State Circuits, vol. 31, No. 12, Dec. 1996, pp. 2046-2050.

* cited by examiner

REDUCED CROSSTALK SENSOR AND METHOD OF FORMATION

FIELD OF THE INVENTION

The present invention relates generally to semiconductor devices, and more particularly, to trench isolation technology for use in semiconductor devices, including CMOS image sensors.

BACKGROUND OF THE INVENTION

CMOS imagers are increasingly being used as low cost imaging devices over charge coupled devices (CCD). A CMOS image sensor circuit includes a focal plane array of pixel cells, each one of the cells including a photo-conversion device for generating and accumulating charge in response to light incident on the pixel cell. Each pixel cell also includes devices, e.g., transistors, for transferring charge from the photo-conversion device to readout circuitry for readout.

Figure 1A:
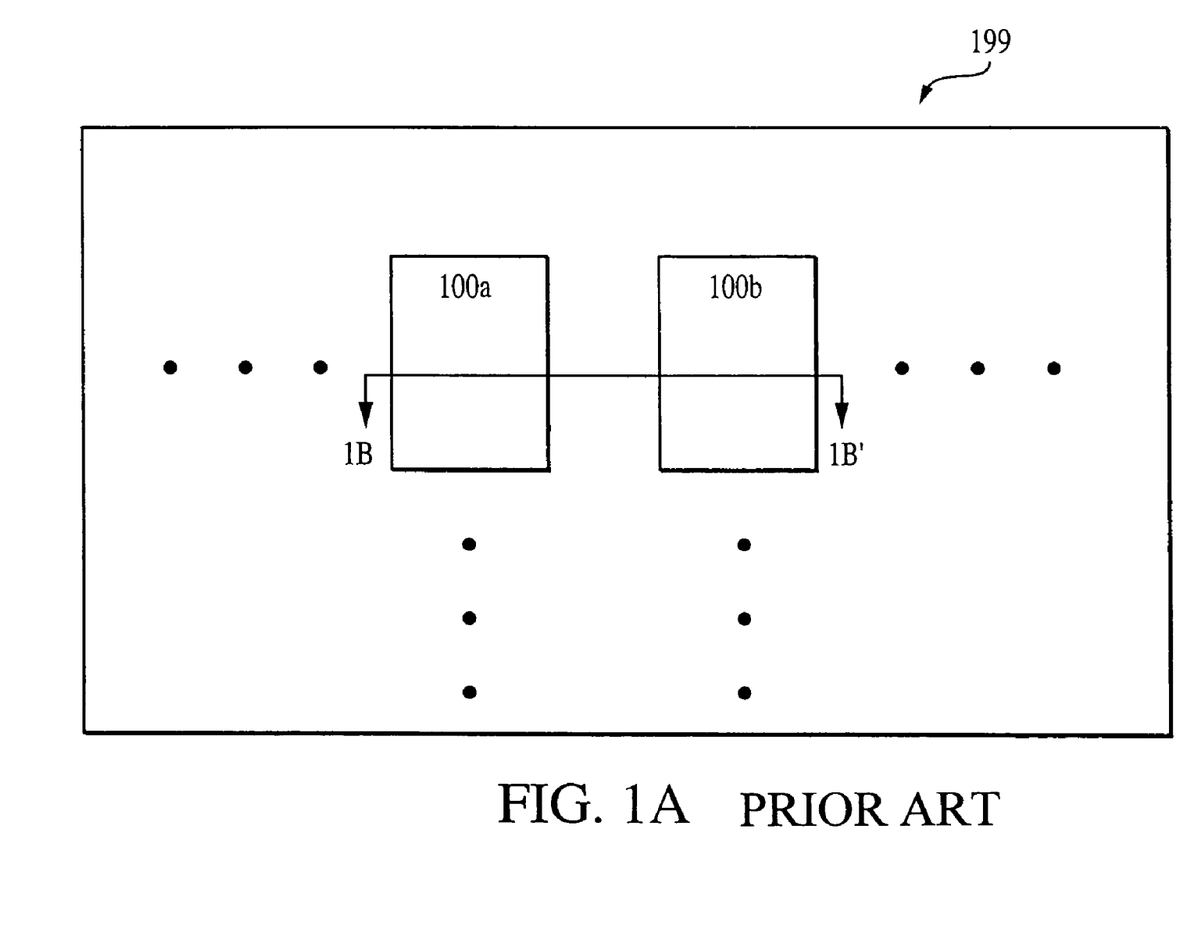
FIG. 1A is a top plan view of two pixels of a CMOS pixel cell.
Figure 1B:
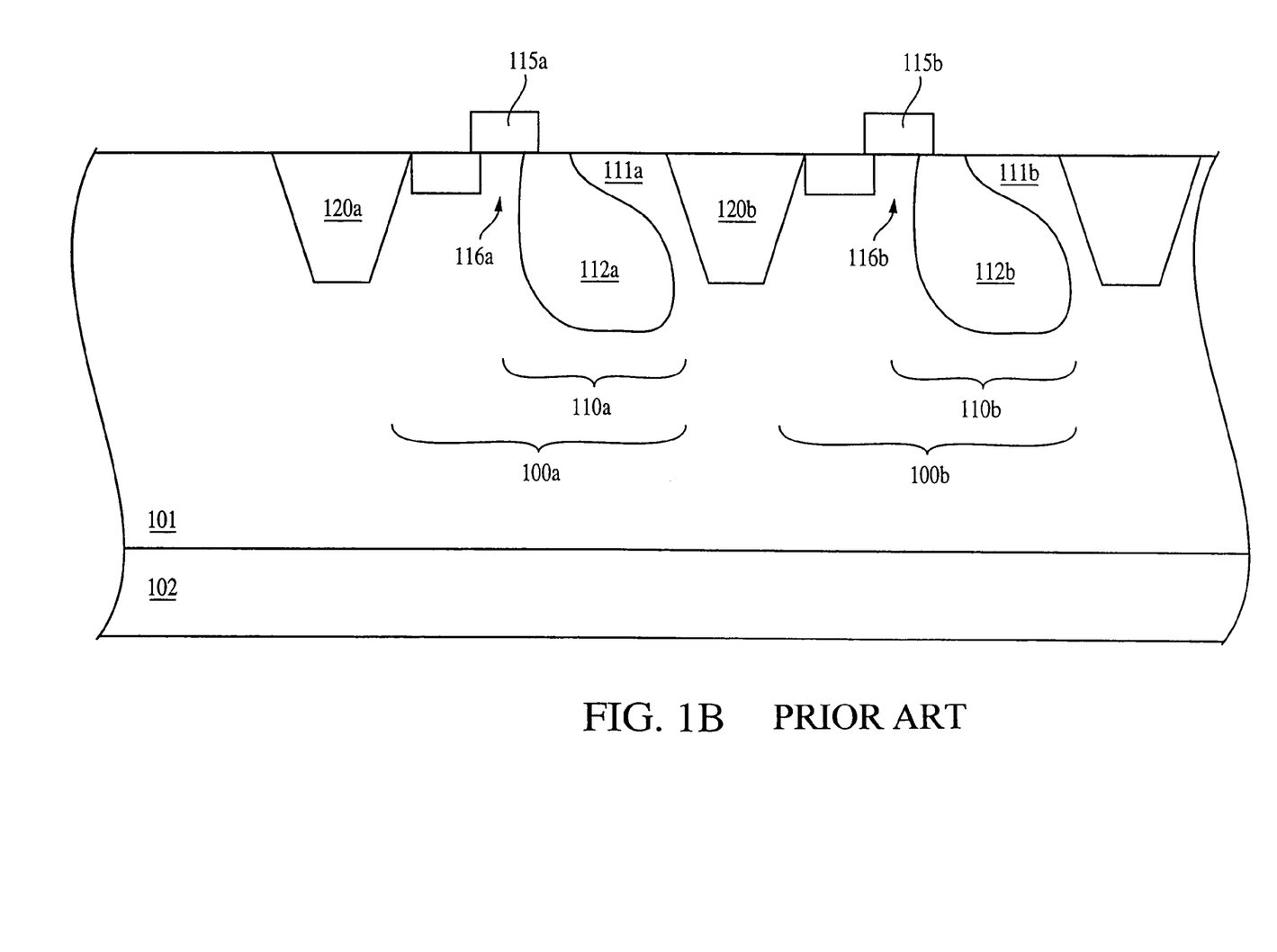
FIG. 1B is a cross sectional view of the pixel cell of FIG. 1A.

FIGS. 1A-1B depict two adjacent conventional CMOS pixel cells 100a, 100b of an array 199. FIG. 1A is a top plan view of the pixel cells and FIG. 1B is a cross-sectional view of the pixel cells of FIG. 1A along line 1B-1B'. Pixel cells 100a, 100b are formed at a surface of a substrate 101. Substrate 101 is a p-type substrate overlying a heavily doped p-type substrate base 102. Each pixel cell 100a, 100b includes a photo-conversion device, which is depicted as a pinned photodiode 110a, 110b. The pinned photodiodes 110a, 110b respectively include a doped p-type surface layer 111a, 111b overlying a doped n-type region 112a, 112b. The n-type regions serve to accumulate charge carriers, e.g., electrons, that are generated by photons of light incident on pinned photodiodes 110a, 110b and absorbed within substrate 101.

There are sensing nodes, which are depicted as floating diffusion nodes 116a, 116b on opposite sides of a respective transfer gate 115a, 115b to pinned photodiode 110. Floating diffusion nodes 116a, 116b are doped n-type regions and receive charge transferred from the pinned photodiodes 110a, 110b by the respective transfer gates 115a, 115b.

While not shown in FIGS. 1A-1B, each pixel cell 100a, 100b also includes a respective reset transistor for resetting their floating diffusion regions 116a, 116b to a predetermined voltage before sensing a signal; and a row select transistor for outputting a signal from a source follower transistor to an output terminal in response to an address signal. CMOS image sensors of the type discussed above are generally known as discussed, for example, in Nixon et al., 256×256 CMOS Active Pixel Sensor Camera-on-a-Chip, IEEE Journal of Solid-State Circuits, Vol. 31(12), pp. 2046-2050 (1996); and Mendis et al., CMOS Active Pixel Image Sensors, IEEE Transactions on Electron Devices, Vol. 41(3), pp. 452-453 (1994). U.S. Pat. Nos. 6,177,333 and 6,204,524 also describe operation of conventional CMOS image sensors, the contents of which are incorporated by reference herein.

Adjacent pixel cells 100a, 100b, and/or other pixel cells (not shown) of array 199, can interfere with each another causing crosstalk, which results in poor image quality. Crosstalk can be either optical or electrical. Isolation techniques have been used to prevent crosstalk between pixel cells. This disclosure concerns electrical isolation techniques to prevent crosstalk. Electrical isolation is complex and depends on a number of factors including photon absorption in the substrate 101, photon wavelength, characteristics of the pinned photodiodes 110a, 110b the life-time of minority carriers, and generation and recombination centers in the substrate 101, among others.

Shallow trench isolation (STI) is one electrical isolation technique, which has been used to isolate pixels cells, as well as devices or circuitry, from one other. In general, for STI, a trench 120a, 120b is etched into the substrate 101 and filled with a dielectric to provide a physical and electrical barrier between adjacent pixels (100a, 110b), devices, or circuitry. The depth of an STI region is generally from about 2000 Angstroms (Å) to about 2500 Å.

One drawback associated with STI is crosstalk from a photon that is absorbed deep within the substrate 101 of pinned photodiodes 110a, 110b. Table 1 shows the absorption depth for photons of different wavelengths in a silicon substrate.

TABLE 1

| Wavelength (Nanometers) | Absorption Depth (Microns) |
| --- | --- |
| 400 | 0.19 |
| 450 | 1.0 |
| 500 | 2.3 |
| 550 | 3.3 |
| 600 | 5.0 |
| 650 | 7.6 |
| 700 | 8.5 |
| 750 | 16 |
| 800 | 23 |
| 850 | 46 |
| 900 | 62 |
| 950 | 150 |
| 1000 | 470 |
| 1050 | 1500 |
| 1100 | 7600 |

Longer wavelength photons are absorbed deep within the substrate 101. Therefore, pinned photodiodes 110a, 110b must have a deeper p-n junction depth to capture the long wavelength photons. In the near-infrared and infrared regions of the spectrum, the absorption depths are high and photons travel far into the substrate 101 before being absorbed and generate charge carriers. Therefore, electrons generated by such photons must travel long distances before reaching the floating diffusion region. Accordingly, there is a greater chance that such electrons will travel to other pixel cells, causing crosstalk between adjacent pixels.

Accordingly, it is desirable to provide an improved isolation technique that prevents crosstalk from one pixel cell to another, and particularly from a pixel cell that absorbs photons having long wavelengths.

BRIEF SUMMARY OF THE INVENTION

The invention provided a deep trench isolation structure and method for reducing crosstalk among semiconductor circuits, and particularly among adjacent photodiodes formed in pixel circuits. Under a preferred embodiment, a trench is etched into a substrate adjacent to a photodiode region, wherein the trench extends to an epitaxial layer below the substrate. Once the trench is formed, a thin oxide layer is formed inside the trench, or alternately, a layer of dielectric material may be directly deposited over the trench. Subsequently, a polysilicon deposition is used to fill the trench.

The foregoing and other advantages and features of the invention will become more apparent from the detailed description of exemplary embodiments provided below with reference to the accompanying drawings.

DETAILED DESCRIPTION OF THE INVENTION

In the following detailed description, reference is made to the accompanying drawings, which form a part hereof, and in which is shown by way, of illustration of specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" refers to a picture element unit cell having an active area and containing a photo-conversion device and other devices, e.g., transistors, for converting electromagnetic radiation to an electrical signal. For purposes of illustration, a representative pixel cells are illustrated in the Figures and description herein, and typically fabrication of all pixels in an image sensor will proceed simultaneously in a similar fashion.

For simplicity, exemplary embodiments described herein are explained with reference to a CMOS image sensor. However, it should be noted that the invention is not limited to CMOS image sensors and may be used in any suitable device, for example, a charge coupled device (CCD) image sensor.

Shallow trench isolation regions for CMOS image sensors generally have a depth of less than about 3000 Angstroms (Å) and are generally around about 2000 Å to about 2500 Å. Typically, STI regions are filled with a conventional insulator, such as oxides or high density plasma (HDP) oxides. However, it is difficult to fill trenches having a depth greater than 2500 Å with conventional insulators due to the limited spacing within the trench, for example, undesirable voids or air gaps are formed when oxides are used to fill trenches having a depth greater than about 2500 Å. The width (W) may vary, but is preferably shorter than the depth (D) of the trench.

Figure 2:
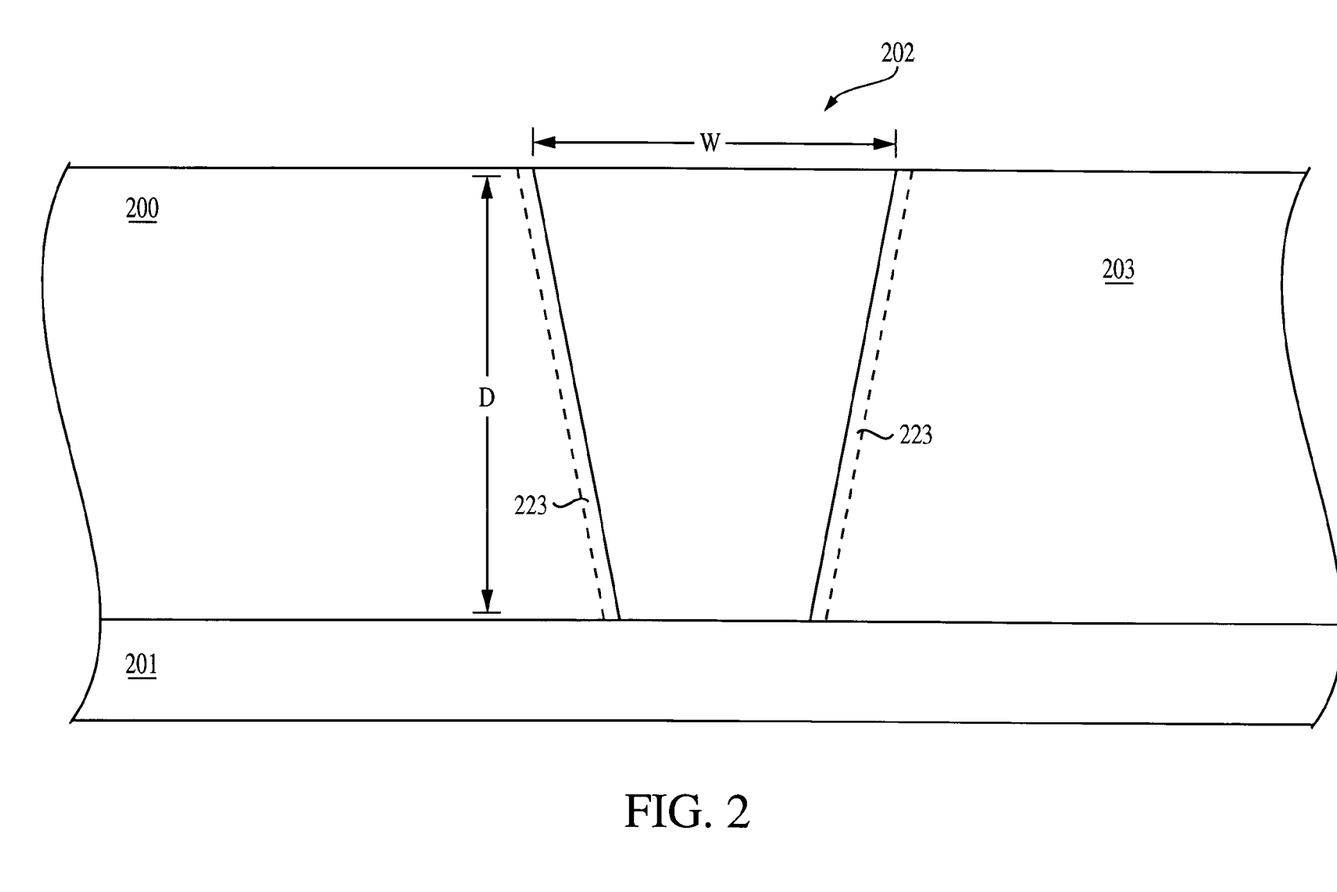
FIG. 2 is a cross sectional view of a trench according to a first exemplary embodiment of the invention.

In accordance with an exemplary embodiment of the invention shown in FIG. 2, a trench 202 is preferably filled with conductive materials containing silicon, preferably polysilicon or silicon-germanium. Conductive materials containing silicon may be easily deposited into trenches of various depths, unlike conventional insulation materials, e.g., silicon dioxide, silicon nitride, NO, ON, HDP, and ONO, which are difficult to fill in deep trenches. Thus, using a conductive material containing silicon, or a combination of such conductive materials containing silicon, to fill the trench 202 allows easy formation of a trench, particularly, a deep trench having a depth (D) greater than about 2000 Å, and preferably about 4000 to about 5000 Å. In a preferred embodiment, the trench 202 should extend to the epi layer 201 as shown in FIG. 2

Generally, the deeper the trench 202 the better the isolation. With respect to CMOS image sensors in particular, the deeper the trench 202 the higher the electron storage capacitance of the CMOS image sensor. A trench according to the invention is deeper than a shallow trench, and accordingly has longer sidewalls than a shallow trench. Therefore, the longer sidewalls allow for a larger electrical connection region 323 along the sidewalls of the trench 202 such that electron storage capacitance, e.g., hole accumulation, in the electrical connection region 323 is increased in accordance with the invention.

The use of a trench in accordance with the invention provides improved isolation between pixels. The deeper trench better inhibits electrons from diffusing under the isolation trench to an adjacent pixel thereby preventing crosstalk between neighboring pixels. Also the deeper trench allows for tighter isolation design rules. Deeper trenches may also be narrower than shallow trenches, while still providing effective isolation between neighboring regions. Accordingly, the source/drain regions of one pixel may be brought closer to the active layer of an adjacent pixel, by narrowing the width of the deep trench.

The fabrication of an exemplary trench 202 is described below with reference to FIGS. 3A-3C. No particular order is required for any of the steps described herein, except for those logically requiring the results of prior actions. Accordingly, while the steps below are described as being performed in a general order, the order is exemplary only and may be altered.

Figure 3A:
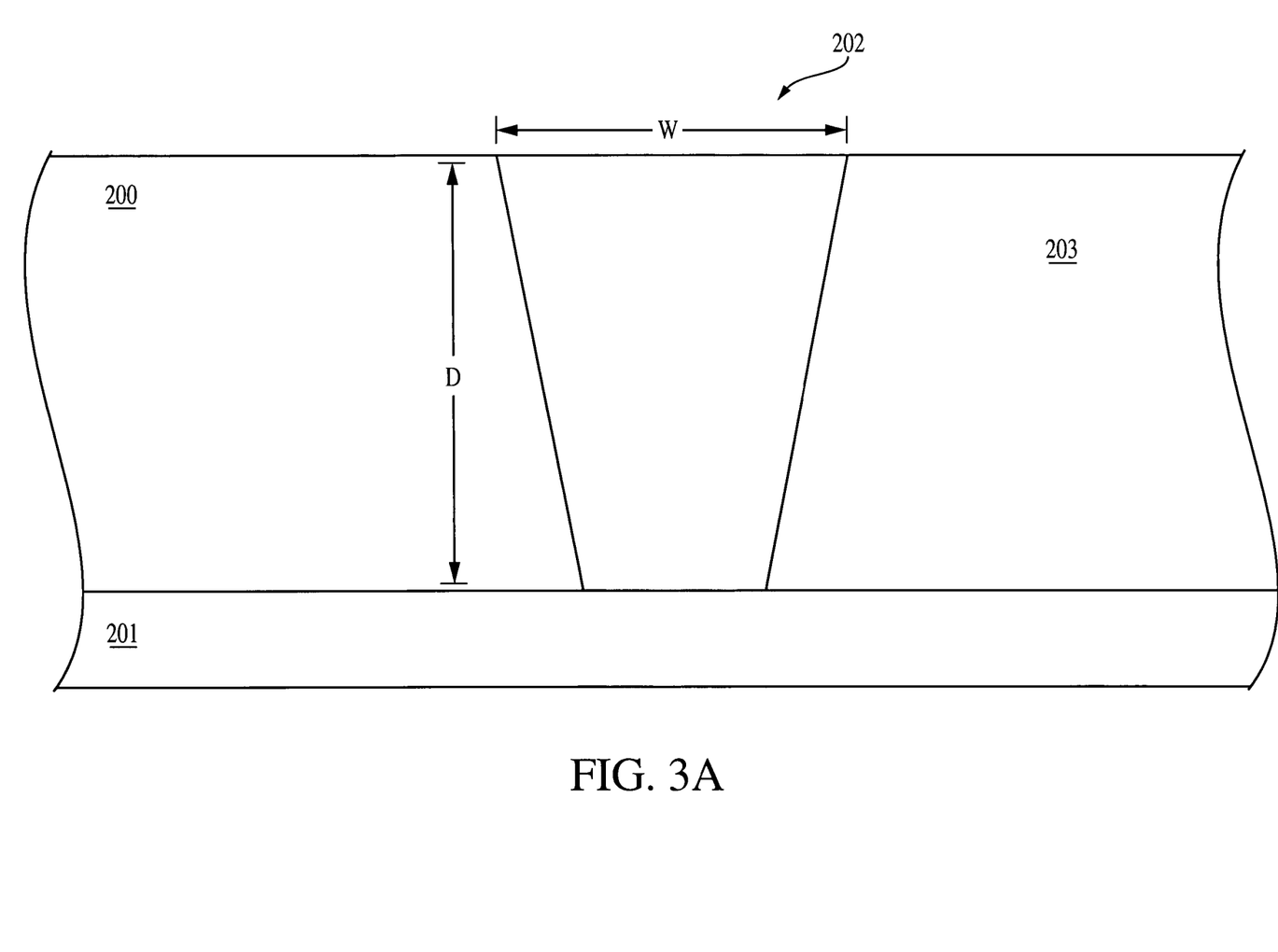
FIG. 3A is a cross sectional view of the pixel cells of FIG. 2A at an intermediate stage of processing.

As shown in FIG. 3A, a trench 202 is etched into substrate 200, which is adjacent to photodiode region 203. The trench 202 preferably extends near, or directly above base layer 201. An anisotropic etch is performed into the silicon substrate 200 to create a deep trench 202. A resist and mask are applied, and photolithographic techniques are used to define the area to be etched-out of substrate 200. A directional etching process, such as Reactive Ion Etching (RIE), or etching with a preferential anisotropic etchant is used to etch into a doped active layer to form the trench 202. The resist and mask are removed leaving a structure that appears as shown in FIG. 3A.

Figure 3B:
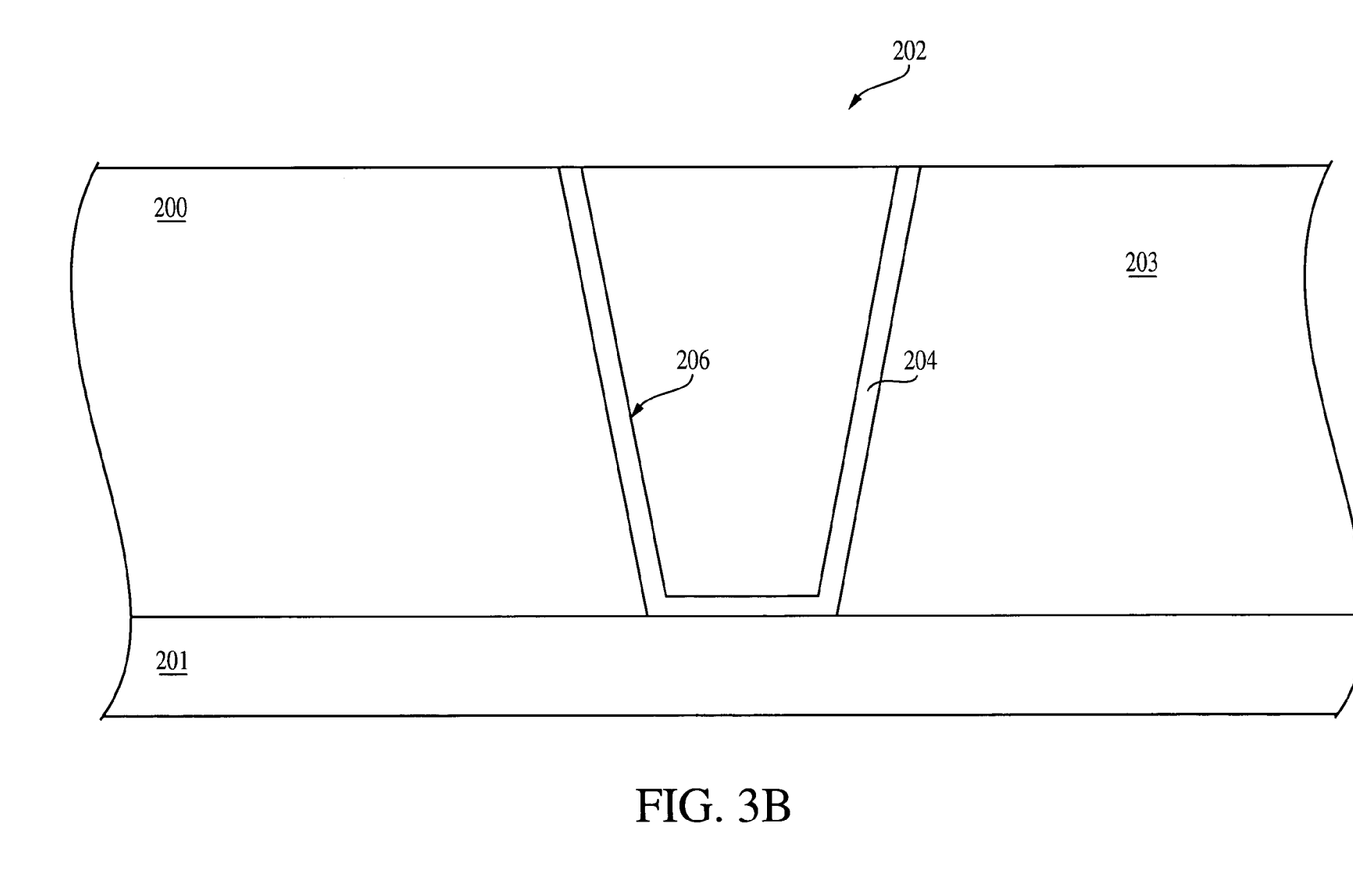
FIG. 3B is a cross sectional view of the pixel cells of FIG. 2A at an intermediate stage of processing.

Referring now to FIG. 3B, an oxide, i.e., silicon oxide, silicon dioxide or other dielectric liner 204, is grown or deposited on sidewalls 210 and bottom 220 of trench 202. The liner may be formed by known techniques and may be a high density plasma (HDP) oxide, a spin on dielectric (SOD), e.g., silicon oxide, or other suitable material. Liner 204 can be substantially conformal such that the thickness of the liner 204 is substantially the same along the sidewalls 210 and at the bottom 220 of the trench 202. In general, the thickness of the dielectric liner 204 along the sidewalls 210 should be at least about 100 Angstroms. Alternatively, a direct deposit of an insulator could be performed.

Furthermore, part of the trench may be filled with disposable, doped oxide material after the trench etch to create a film over the trench. The disposable oxide film may be boron-doped BSG, or phosphor-doped PSG, or other suitable material. After the film is deposited in the trench, a HF dip will remove part of the film from the top of the trench, leaving film only along the sidewalls and bottom of the trench. A short anneal process then follows to out-diffuse dopants from the film to the sidewalls of the trench. In this manner, the boron-doped BSG acts as a solid-source diffusion source for boron.

In the case of a PNP photodiode having a BSG film, a high concentration boron doped region will be formed near the sidewall and the bottom of the trench. This high-doped region will serve to connect the top surface p-layer 203 to the bottom p-substrate epi layer 201 in a pinned photodiode structure. Also, high conical sidewalls without the use of high dose implants can create a good interface without defects for reduced dark current.

Figure 3C:
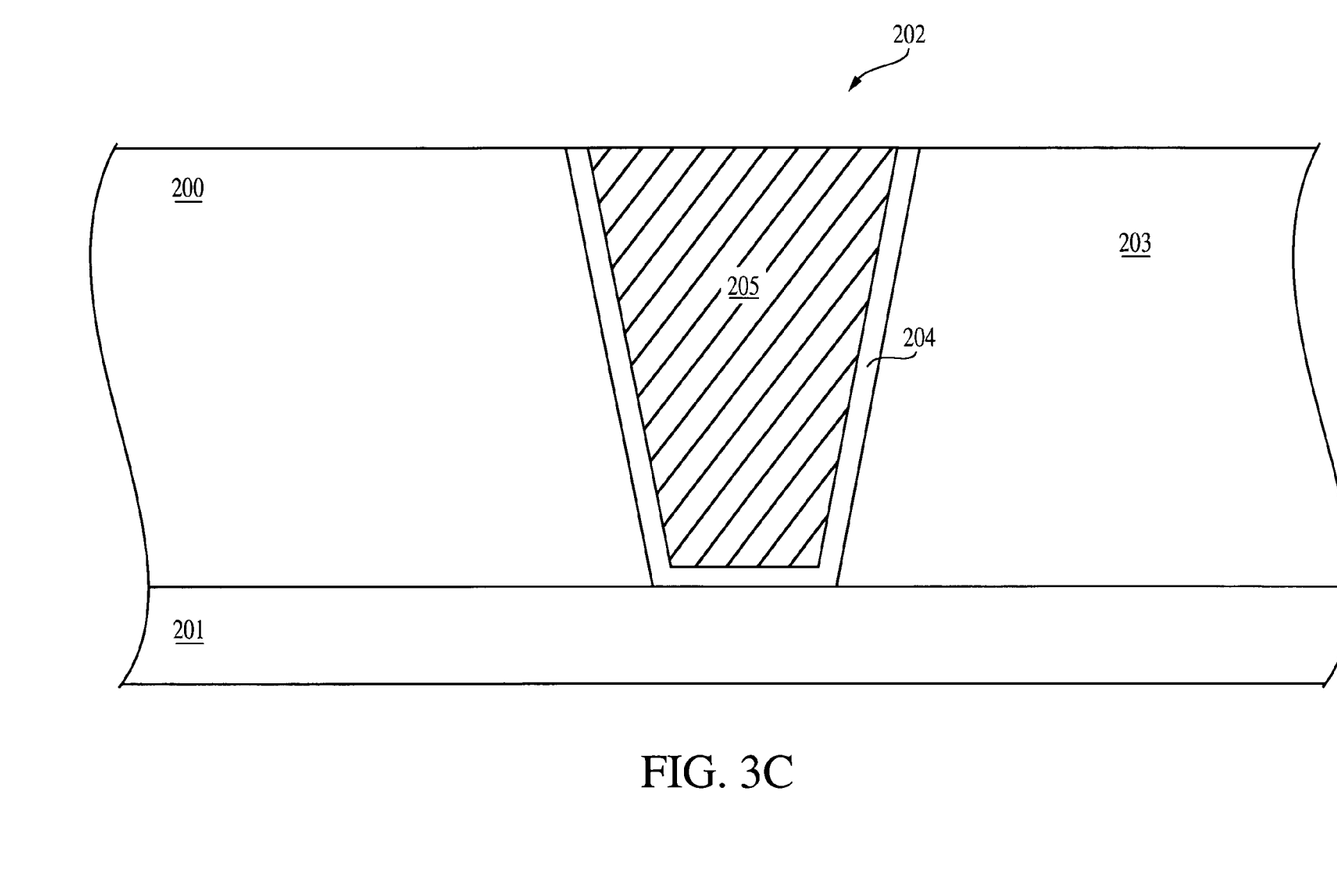
FIG. 3C is a cross sectional view of the pixel cells of FIG. 2A at an intermediate stage of processing.

Referring now to FIG. 3C, a highly doped (in-situ doped) n-type or p-type conductive material containing silicon 205 is deposited to fill the trench 202. Suitable conductive materials containing silicon include polysilicon and silicon-germanium. Alternatively, the trench 202 may be filled with an undoped conductive material containing silicon, which can remain free of dopants or be subsequently implanted with dopants. If the trench is filled with undoped polysilicon that is to be doped, a masked ion implant may be performed to dope the conductive material containing silicon. For example, in the case of a p-type active layer, with p-type wells, p-type ions such as boron (B) can be implanted into the conductive material 205 containing silicon using a photoresist mask.

Depending on the placement of the epi layer 201, the depth of the trench can be tailored to extend to the surface of epi layer 201. For example, if the starting epi thickness is 4 μm deep, a trench having a depth of 3 μm would help to connect the buried p or n epi layer 201 to the upper surface p or n layer 203 after it diffuses out 1.5 μm towards the surface during the processing steps described above. A much deeper trench (e.g., 8 μm) may be used for such applications as infra-red, or near infra-red sensors.

Figure 4:
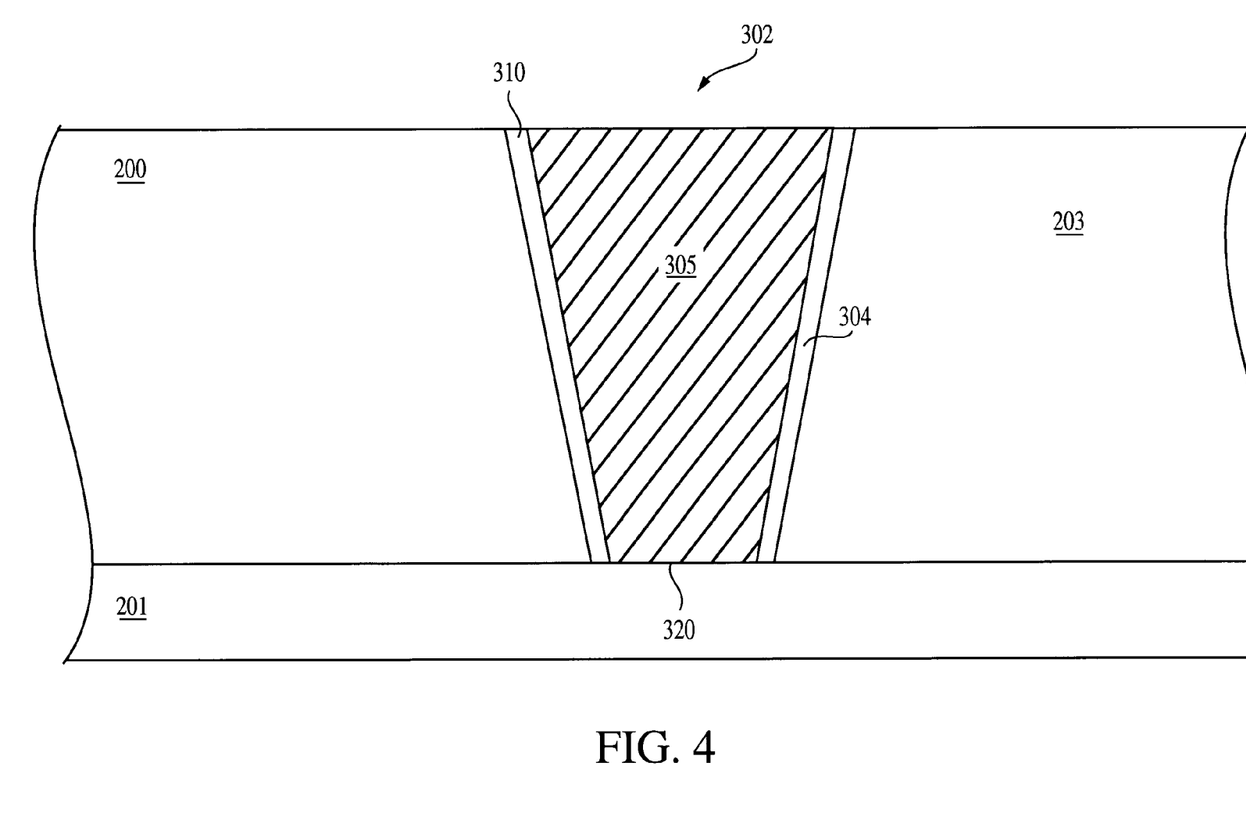
FIG. 4 is a cross sectional view of a trench according to a second exemplary embodiment of the invention.

FIG. 4 illustrates yet another embodiment of the present invention, according to which trench 302 is lined with an oxide or dielectric liner 304 only on the sidewalls of the trench, and not on its bottom. In this manner, the material filling the trench 302, for example, highly doped polysilicon, directly contacts the epi layer 201 located beneath the trench, providing a hookup area to the substrate 200. In addition, the two sidewall STI layers isolate adjacent pixels and provide better scaling.

As in the previously described embodiment, the trench 302 is etched into substrate 200, which is adjacent to photodiode region 203. The trench 202 preferably extends near, or directly above base layer 201. An anisotropic etch is performed into the silicon substrate 200 to create a deep trench. A resist and mask are applied, and photolithographic techniques are used to define the area to be etched-out of substrate 200. A directional etching process, such as Reactive Ion Etching (RIE), or etching with a preferential anisotropic etchant is used to etch into a doped active layer to form the trench 302.

An oxide, such as silicon oxide, silicon dioxide or other dielectric liner 304 is grown or deposited on sidewalls 310 but not on bottom 320 of trench 302, as also shown in FIG. 4. The formation of the dielectric liner 304 only on sidewalls 310 may be accomplished, for example, by masking the bottom 320 of the trench 302 and then forming the dielectric liner 304 on the sidewalls 310. Alternatively, the dielectric liner 304 may be first formed within the trench 302, on both the sidewalls 310 and the bottom 320, and then removed from the bottom 320. An etching process, such as an HF dip for example, may be conducted to remove part of the film from the bottom of the trench, leaving dielectric film only along the sidewalls of the trench. Liner 304 may be formed by known techniques and may be a high density plasma (HDP) oxide, a spin on dielectric (SOD), e.g., silicon oxide, or other suitable material. In general, the thickness of the dielectric liner 304 along the sidewalls 310 should be at least about 100 Angstroms.

A highly doped (in-situ doped) n-type or p-type conductive material containing silicon 305 is next deposited to fill the trench 302. Suitable conductive materials containing silicon include polysilicon and silicon-germanium. Alternatively, the trench 302 may be filled with an undoped conductive material containing silicon, which can remain free of dopants or be subsequently implanted with dopants. If the trench is filled with undoped polysilicon that is to be doped, a masked ion implant may be performed to dope the conductive material containing silicon. For example, in the case of a p-type active layer, with p-type wells, p-type ions such as boron (B) can be implanted into the conductive material 305 containing silicon using a photoresist mask.

Figure 5:
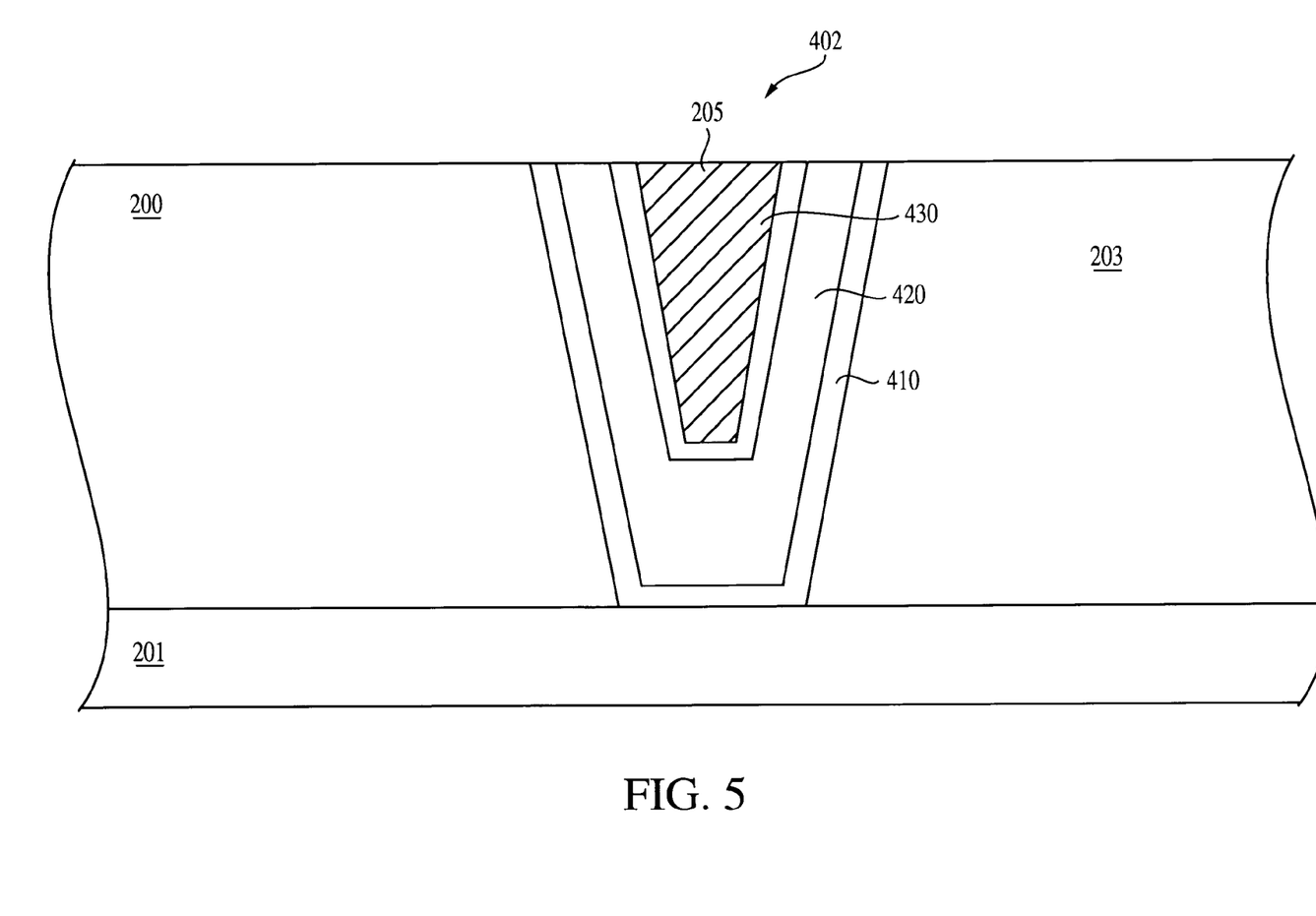
FIG. 5 is a cross sectional view of a trench according to a third exemplary embodiment of the invention.

FIG. 5 illustrates yet another embodiment of the present invention, according to which trench 402 incorporates a plurality of dielectric films, at least two of each having different refractive indices. For example, FIG. 5 depicts trench 402 containing three materials 410, 420 and 430 having different refractive indices. Based on the refractive indices, the layering structure of materials 410, 420 and 430 is configured so that photons entering the trench 402 from adjacent circuitry will be reflected away from the photodiode region 203. Illustratively, material 410 has a greater refractive index that that of material 420, which in turn has a greater refractive index than that of material 430. For exemplary purposes only, the materials having different refractive indices may comprise any dielectric material, such as undoped polysilicon, silicon dioxide, aluminum dioxide, spin-on-dielectric (SOD), silicon nitride, or any combination of these dielectric materials.

A combination of PE-oxide (PECVD oxide) with a refractive index of 1.46 and FSG-oxide (fluorinated silica glass oxide) with a refractive index of 1.435, as well as PE-oxide and FSG-oxide multiple layers, may be also used as combinations of materials with different refractive indices to fill in trench 402. The PE-oxide/FSG-oxide combination for improving optical crosstalk above the silicon active area of a CMOS image sensor is disclosed, for example, by Hsu et al. in *Light Guide for Pixel Crosstalk Improvement, Deep Submicron CMOS Image Sensor*, IEEE Vol. 25, No. 1 (January 2004), the disclosure of which is incorporated by reference herein. By engineering the refractive index between two dielectric materials, for example, the total internal reflection (TIR) is minimized so that the photons that would otherwise get lost are confined and they bounce off an interface that has refractive index difference between the two materials. This, in turn, allows an increase in the quantum efficiency of the array.

Figure 6:
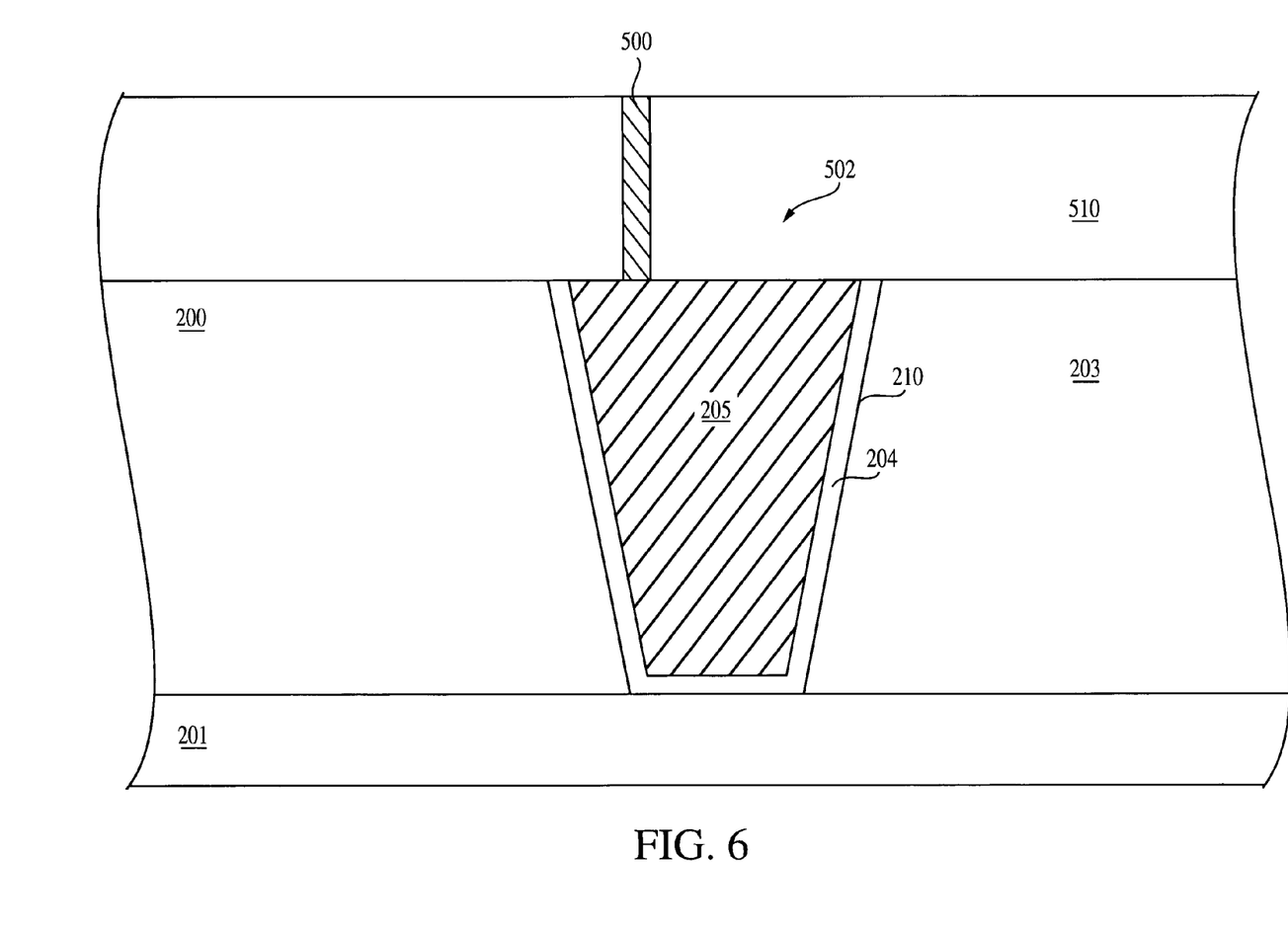
FIG. 6 is a cross sectional view of a trench according to a fourth exemplary embodiment of the invention.

Reference is now made to FIG. 6 which illustrates yet another embodiment of the present invention. According to this embodiment, a contact 500 is dropped to the conductive material 205 of trench 502 so that any trapped charge into the conductive material 205 may be efficiently removed. The trench 502 is similar to the trench 202 of FIGS. 3A-3B and is formed by a process similar to that for the formation of the trench 202. The difference between the trenches 502 and 202 is that the trench 502 has contact 500 to the conductive material 205 inside of the trench 502.

Providing contact 500 may be accomplished by strapping the conductive material 205 (for example, highly doped polysilicon or undoped conductive material containing silicon) in the array together and dropping a contact in the edge of the array. In this manner, by providing a contact to the conductive material 205 inside of the trench 502, it is possible to bias the conductive material (for example polysilicon) negative or positive. Depending on the pinned photodiode structure and the doping type of the polysilicon, this bias can be adjusted to create an accumulation region around the sidewalls of the STI. By doing so, it is possible to reduce or eliminate the need for doping the sidewall region. For example, in a PNP pinned photodiode, the sidewall has to be p-type to hookup to the substrate. If the conductive material 205 inside of the trench 502 is n+ polysilicon, this material can be biased negatively to create a hole-rich accumulation region on the sidewalls 210 of the trench 502. Alternatively, if the conductive material 205 inside of the trench 502 is p+ polysilicon, then the p+ polysilicon would be biased positively. The bias may be in the range of about 100 to 500 mV in absolute value. For a NPN pinned photodiode, the bias conditions would be reversed to create an electron-rich accumulation region on the sidewalls 210 of the trench 502.

Figure 7:
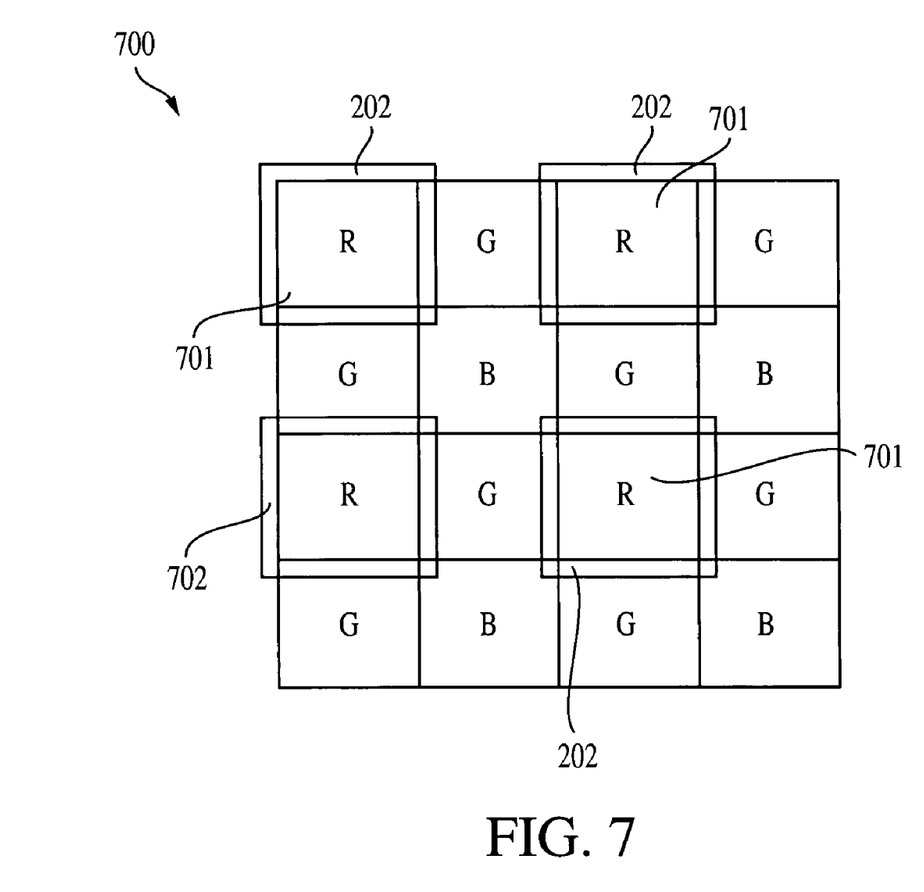
FIG. 7 illustrates a trench of the present invention surrounding red pixels of a Bayer pattern.

FIG. 7 illustrate an exemplary application of the deep trench isolation structures of the present invention to a color filter array 700 for capturing images in a digital camera, for example. The color filter array 700 comprises a plurality of deep trench isolation structures, such as the deep trench isolation structures 202 of FIGS. 3A-3C, for example, provided around the perimeter of predefined pixels 701 covered by corresponding color filters. For exemplary purposes only, the color filter array 700 of the present invention comprises deep trench isolation structures 202 surrounding red pixels 701 of a color filter array Bayer pattern. However, the deep trench isolation structures of the present invention may be used for isolating pixel cells of any known color filter array, and thus the invention is not limited to a Bayer color filter array.

As known in the art, a Bayer pattern comprises pixels which are represented by squares in the grid of FIG. 7. Each pixel includes an electronic sensor which measures the light falling on it. Pixels 701 have a red filter to measure red light and are represented by an R in the pattern. Those pixels which have a green filter measure green light and are represented by a G in the pattern, and those pixels which have a blue filter measure blue light and are represented by a B in the pattern. The Bayer pattern is replicated throughout the entire color filter array in both the horizontal and vertical directions. By providing deep trenches around the red pixels of a color filter array, such as the Bayer color filter array of FIG. 7, crosstalk between the red pixels (which have a deeper photon absorption than the green and blue pixels) is decreased and the image quality is accordingly increased.

Although the deep trench isolation structures have been illustrated in FIG. 7 as completely surrounding the red pixels 701 of a Bayer color filter array, it must be understood that this embodiment is only exemplary. As such, the present invention also contemplates the formation of deep trench isolation structures, such as the deep trench isolation structures 202, 302, 402, 502 of the present invention, only partially surrounding red pixels of a color filter array, such as the red pixels 701 of the Bayer pattern of FIG. 7. In addition, the deep trench isolation structures of the present invention may be formed surrounding totally or partially other pixels of a color filter array, for example the green pixels, or a combination of the red, green and blue pixels of a color array, as desired.

Figure 8:
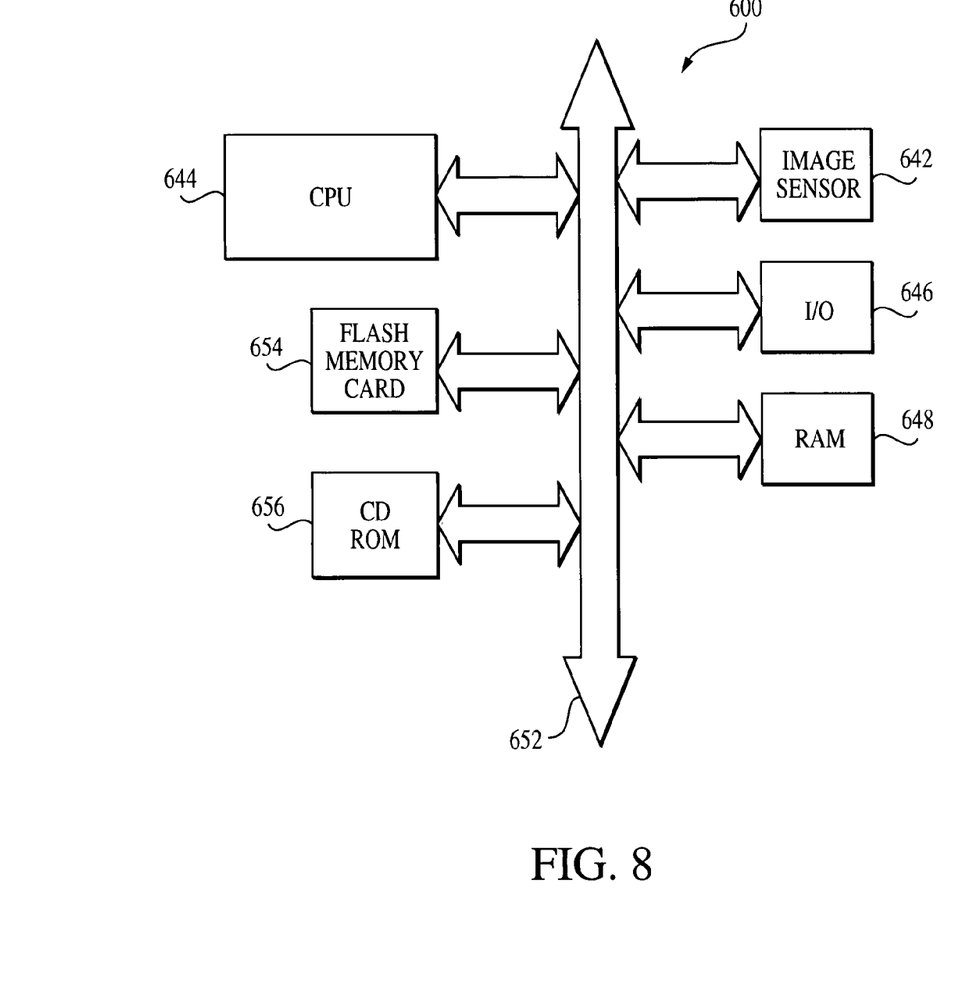
FIG. 8 is a schematic diagram of a processor system incorporating an exemplary embodiment of the invention.

A processor based system 600, which includes a CMOS image sensor 642 according to the invention is illustrated in FIG. 8. Processor based system 600 is exemplary of a system having digital circuits, which could include an image sensor. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

Processor based system 600, such as a computer system, for example generally comprises a central processing unit (CPU) 644, for example, a microprocessor, which communicates with an input/output (I/O) device 646 over a bus 652. The CMOS image sensor 642 also includes an IC with a single or multiple isolation trench structures such as the deep trench isolation structures 202, 302, 402, 502 of the present invention. The CMOS image sensor 642 also communicates with components of the system 600 over bus 652. The computer system 600 also includes random access memory (RAM) 648, and, in the case of a computer system may include peripheral devices such as a flash memory card 654, or a compact disk (CD) ROM drive 656, which also communicate with CPU 644 over the bus 652. It may also be desirable to integrate the processor 654, CMOS image sensor 642 and memory 648 on a single IC chip.

While the above embodiments are described in connection with the formation of PNP-type photodiodes the invention is not limited to these embodiments. The invention also has applicability to other types of photodiodes and to photodiodes formed from npn regions in a substrate. If an NPN-type photodiode is formed the dopant and conductivity types of all structures would change accordingly.

The above description and drawings are only to be considered illustrative of exemplary embodiments, which achieve the features and advantages of the invention. Modification and substitutions to specific process conditions and structures can be made without departing from the spirit and scope of the invention. While the above embodiments are described in connection with the formation of PNP-type photodiodes the invention is not limited to these embodiments. Accordingly, the invention is not to be considered as being limited by the foregoing description and drawings, but is only limited by the scope of the appended claims.

The invention claimed is:

1. An image sensor comprising:
    a substrate formed over a base layer;
    a plurality of pixel cells formed within said substrate, each pixel cell comprising a photo-conversion device having a charge collection region of a second conductivity type for accumulating photo-generated charge formed in said substrate below a first layer of a first conductivity type; and
    a plurality of trenches, each trench being provided along a perimeter of a respective pixel cell, each trench extending at least to a surface of the base layer and below a lower level of said photo-conversion device, each trench having sidewalls, and being at least partially filled with a material that inhibits electrons from passing through said trench,
    wherein each of said plurality of trenches prevents diffusion of photo-generated charge generated by said photo-conversion device in one pixel cell to an adjacent pixel cell.

2. The sensor of claim 1, further comprising a dielectric material formed along at least a portion of said sidewalls.

3. The sensor of claim 2, wherein the dielectric material is an oxide.

4. The sensor of claim 2, wherein the dielectric material is formed on the sidewalls of the trench but not on a bottom of the trench.

5. The sensor of claim 2, wherein the dielectric material comprises at least two materials having different indices of refraction.

6. The sensor of claim 2, wherein said dielectric material formed is substantially conformal such that thickness of said dielectric material is substantially same along said sidewalls and a bottom of said trench.

7. The sensor of claim 6, wherein thickness of said dielectric material along said sidewalls is at least about 100 Angstroms.

8. The sensor of claim 1, wherein said material is a conductive material.

9. The sensor of claim 8, wherein said conductive material comprises one of doped polysilicon, undoped polysilicon and boron-doped carbon.

10. The sensor of claim 1, wherein said trench has a depth greater than about 2000 Angstroms.

11. The sensor of claim 10, wherein said trench has a depth in the range of about 4000 to about 5000 Angstroms.

12. The sensor of claim 1, wherein the sensor comprises a CMOS image sensor.

13. The sensor of claim 1, wherein the sensor comprises a CCD image sensor.

14. The sensor of claim 1, wherein the pixel cells are red pixel cells of a Bayer pattern.

15. The sensor of claim 1, further comprising a contact adjacent at least one of the plurality of trenches, for biasing the material within the trench positive or negative.

16. The sensor of claim 1, wherein the base layer is an epitaxial layer.

17. A structure for isolating an active area on a semiconductor device, said structure comprising:
  a photo-conversion device comprising a doped charge collection region of a second conductivity type for accumulating charge formed in said active area below a first region of a first conductivity type;
  a trench formed in a substrate along at least a portion of a periphery of said active area in said semiconductor device, wherein said trench extends at least to a surface of a base layer below said substrate which is below a lower level of said photo-conversion device, and wherein said trench has sidewalls;
  a dielectric liner formed along said sidewalls; and
  a material formed over said dielectric liner that at least partially fills said trench and inhibits electrons from passing through said trench,
  wherein said trench prevents diffusion of electrons from said doped charge collection region into a region outside said active area.

18. The structure of claim 17, wherein the dielectric liner comprises an oxide material.

19. The structure of claim 17, wherein the dielectric liner is one of high-density plasma oxide and spin-on dielectric oxide.

20. The structure of claim 17, wherein the dielectric liner is formed of a material selected from the group consisting of silicon dioxide, aluminum oxide, undoped polysilicon, silicon nitride, PE-oxide and FSG-oxide.

21. The structure of claim 17, wherein the dielectric liner is formed of at least two materials having different indices of refraction.

22. The structure of claim 17, wherein the dielectric liner is formed of PE-oxide and FSG-oxide.

23. The structure of claim 17, wherein the material is a conductive material.

24. The structure of claim 23, wherein the conductive material comprises one of doped polysilicon, undoped polysilicon and boron-doped carbon.

25. The structure of claim 17, wherein the trench has a depth greater than about 2000 Angstroms.

26. The structure of claim 25, wherein the trench has a depth in the range of about 4000 to about 5000 Angstroms.

27. The structure of claim 17, wherein the semiconductor device comprises one of a CMOS image sensor or a CCD image sensor.

28. The structure of claim 17, further comprising a contact adjacent the trench, for biasing the material within the trench positive or negative.

29. A processing system, said processing system comprising:
  a processor;
  a semiconductor device;
  a trench formed in a substrate along at least a portion of a periphery of said active area in said semiconductor device, the active area having a photo-conversion device comprising a charge collection region of n-type conductivity for accumulating charge and located below a p-type region of said active area, wherein said trench extends at least to a surface of a base layer below said substrate and to a level below a lower level of said photo-conversion device, and wherein said trench has sidewalls and inhibits diffusion of charge outside said active area;
  a dielectric liner formed along said sidewalls; and
  a material formed over said insulating liner that at least partially fills said trench.

30. The processing system of claim 29, wherein the dielectric liner is an oxide material.

31. The processing system of claim 29, wherein the dielectric liner is one of high-density plasma oxide and spin-on dielectric oxide.

32. The processing system of claim 29, wherein the conductive material comprises one of doped polysilicon, undoped polysilicon and boron-doped carbon.

33. The processing system of claim 29, wherein the trench has a depth greater than about 2000 Angstroms.

34. The processing system of claim 33, wherein the trench has a depth in the range of about 4000 to about 5000 Angstroms.

35. The processing system of claim 29, wherein the semiconductor device comprises a CMOS image sensor.

36. The processing system of claim 29, wherein the semiconductor device comprises a CCD image sensor.

37. The processing system of claim 29, wherein the dielectric liner comprises at least two materials having different indices of refraction.

38. The processing system of claim 29, wherein the dielectric liner comprises PE-oxide and FSG-oxide.

39. The processing system of claim 29, wherein the dielectric liner is provided along the sidewalls of the trench but not on a bottom of the trench.

* * * * *

UNITED STATES PATENT AND TRADEMARK OFFICE
CERTIFICATE OF CORRECTION

| | |
|---|---|
| PATENT NO. | : 7,492,027 B2 |
| APPLICATION NO. | : 10/781706 |
| DATED | : February 17, 2009 |
| INVENTOR(S) | : Mouli |

It is certified that error appears in the above-identified patent and that said Letters Patent is hereby corrected as shown below:

In column 9, line 8, in Claim 6, before "is" delete -- formed --.

In column 9, line 12, in Claim 7, delete "at least" and insert -- greater than --, therefor.

Signed and Sealed this

Twenty-eighth Day of April, 2009

JOHN DOLL
*Acting Director of the United States Patent and Trademark Office*